(12) United States Patent
Mirjafari et al.

(10) Patent No.: US 9,910,103 B2
(45) Date of Patent: Mar. 6, 2018

(54) SAFETY-COMPLIANT PSU FAULT DIAGNOSIS MECHANISM TO REDUCE PSU FIELD RETURNS

(71) Applicant: DELL PRODUCTS, L.P., Round Rock, TX (US)

(72) Inventors: Mehran Mirjafari, Austin, TX (US); Mark Muccini, Georgetown, TX (US); Scott Michael Ramsey, Cedar Park, TX (US); Wei Chen, Shanghai (CN); Bhavesh Govindbhai Patel, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 8 days.

(21) Appl. No.: 14/955,462

(22) Filed: Dec. 1, 2015

(65) Prior Publication Data

US 2017/0153294 A1  Jun. 1, 2017

(51) Int. Cl.
*G01R 31/3187* (2006.01)
*G01R 31/40* (2014.01)
*G01R 31/28* (2006.01)

(52) U.S. Cl.
CPC ......... *G01R 31/40* (2013.01); *G01R 31/2884* (2013.01)

(58) Field of Classification Search
CPC ........ G01R 31/31924; G01R 31/31922; G01R 31/31937; G01R 31/40; G01R 31/31721; G01R 31/42; G01R 31/3191; G01R 31/2886; G01R 31/2805; G01R 31/024; G01R 31/2812; G01R 31/2884; G01R 31/2853; G01R 19/16538; G01R 31/2827; G01R 31/327; G01R 31/3271–31/3274
USPC .......... 324/764.01, 750.01, 750.02, 537, 771
See application file for complete search history.

(56) References Cited

U.S. PATENT DOCUMENTS

| | | | |
|---|---|---|---|
| 6,301,133 B1 * | 10/2001 | Cuadra | H02J 1/102 363/65 |
| 6,615,146 B1 * | 9/2003 | Malik | G01R 19/16538 361/90 |
| 7,636,011 B2 * | 12/2009 | Frederick | H02J 1/10 327/530 |
| 8,340,933 B1 | 12/2012 | King, Jr. et al. | |
| 2008/0301476 A1 * | 12/2008 | Itakura | H02H 3/087 713/300 |

(Continued)

*Primary Examiner* — Thang Le
(74) *Attorney, Agent, or Firm* — Isidore PLLC

(57) ABSTRACT

A power supply unit (PSU) performs a PSU fault diagnosis using a PSU fault detection module. The PSU fault detection module detects a diagnostic trigger event and initiates a series of checks of selected sub-systems. The PSU fault detection module determines whether the trigger event occurred while the PSU was connected within an information handling system (IHS) or physically removed from the IHS. If the trigger event occurred while the PSU was connected within an information handling system (IHS), the PSU fault detection module electrically isolates the PSU from the IHS using an ORing device, which blocks current flowing into the PSU. The PSU fault detection module determines whether a short circuit exists within the electrically isolated PSU. If a short circuit is identified, the PSU fault detection module determines that the PSU is not functioning properly and provides a notification of a malfunction of the PSU.

18 Claims, 6 Drawing Sheets

(56) References Cited

U.S. PATENT DOCUMENTS

| | | | |
|---|---|---|---|
| 2011/0102951 A1* | 5/2011 | Wu | H02H 7/1206 361/18 |
| 2013/0181729 A1* | 7/2013 | Egan | G01R 31/40 324/750.01 |
| 2014/0189379 A1* | 7/2014 | Faulkner | G06F 1/263 713/300 |
| 2016/0259390 A1* | 9/2016 | Tomas | G06F 1/30 |

* cited by examiner

SAFETY-COMPLIANT PSU FAULT DIAGNOSIS MECHANISM TO REDUCE PSU FIELD RETURNS

BACKGROUND

1. Technical Field

The present disclosure generally relates to information handling systems (IHSs) and in particular to power supply unit (PSU) diagnostics within IHSs.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

When power related failures occur within the IHS, trained datacenter technicians are often deployed to remove and replace failed or suspect power supply units (PSUs). PSU test solutions and/or power testing equipment are generally not available to provide a first order PSU power up test. As a result, those power supplies deemed as "failed" are returned to the manufacturer. However, although some of power related failures are legitimate power supply failures, a large majority of power supply "failures" are designated as "cannot duplicate", "CND". The CND designation is given when a "suspect" power supply has been returned to the manufacturer, reviewed and tested without defect.

BRIEF SUMMARY

Disclosed are a method and a power supply unit (PSU) that performs a PSU fault diagnosis using a PSU fault detection module. The PSU fault detection module detects an event that matches one of a plurality of pre-established PSU diagnostic trigger events and initiates a series of checks of selected sub-systems. The PSU fault detection module determines whether the trigger event occurred while the PSU was connected within an information handling system (IHS) or physically removed from the IHS. If the PSU fault detection module determines that the trigger event is a fault event that occurred while the PSU was connected within an information handling system (IHS), the PSU fault detection module attempts to electrically isolate the PSU from the IHS using an ORing device, which blocks current flowing into the PSU. In particular, the PSU fault detection module attempts to provide a regulated low voltage that places the ORing device in an OFF state. If the regulated low voltage is successfully provided, the PSU fault detection module confirms that the ORing device is functioning properly while electrically isolating the PSU from the IHS. The PSU fault detection module is able to determine whether a short circuit exists within an electrically isolated PSU. If a short circuit exists, the PSU fault detection module determines that the PSU is not functioning properly and provides a notification of a malfunction of the PSU.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
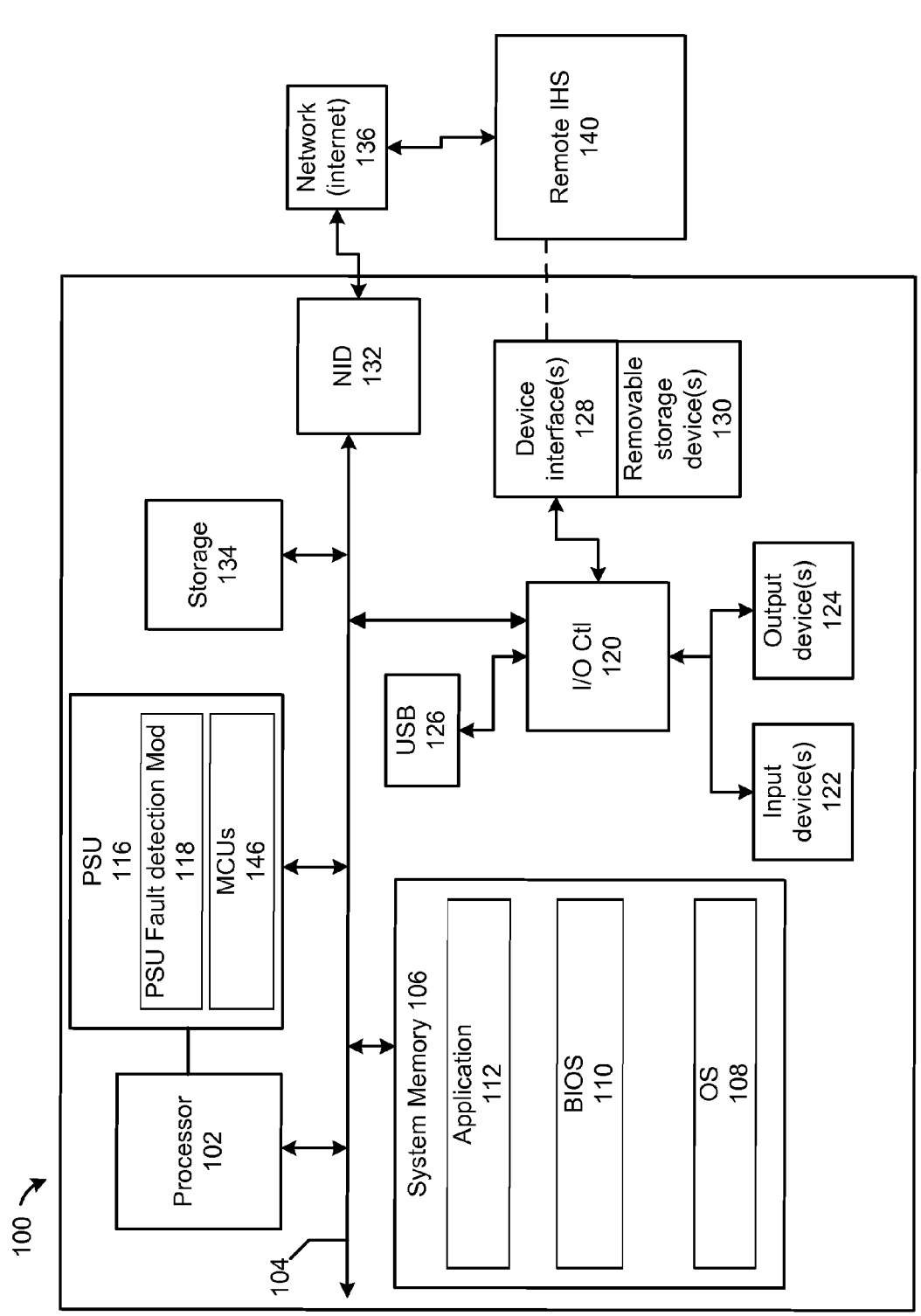
FIG. 1 illustrates an example information handling system (IHS) within which various aspects of the disclosure can be implemented, according to one or more embodiments.

The illustrative embodiments provide a method and a power supply unit (PSU) that performs a PSU fault diagnosis using a PSU fault detection module. A PSU fault detection module detects an event that matches one of a plurality of pre-established PSU diagnostic trigger events and initiates a series of checks of selected sub-systems. The PSU fault detection module determines whether the trigger event occurred while the PSU was connected within an information handling system (IHS) or physically removed from the IHS. If the PSU fault detection module determines that the trigger event is a fault event that occurred while the PSU was connected within an IHS, the PSU fault detection module attempts to electrically isolate the PSU from the IHS using an ORing device, which blocks current flowing into the PSU. In particular, the PSU fault detection module attempts to provide a regulated low voltage that places the ORing device in an OFF state. If the regulated low voltage is successfully provided, the PSU fault detection module confirms that the ORing device is functioning properly while electrically isolating the PSU from the IHS. The PSU fault detection module is able to determine whether a short circuit exists within an electrically isolated PSU. If a short circuit exists, the PSU fault detection module determines that the PSU is not functioning properly and provides a notification of a malfunction of the PSU.

In one or more aspects, if the PSU fault detection module determines that the event is a power-up event that occurred while the PSU was electrically removed from the IHS, and which follows a fault event, the PSU fault detection module performs checks of selected sub-systems, while turning on the PSU. In addition, the PSU fault detection module limits a level of the PSU output current in order to satisfy Safe Extra Low Voltage (SELV) requirements. If an additional event, which is a new, different type of event, occurs while the checks are being performed, the PSU fault detection module determines that the PSU is not functioning properly.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Those of ordinary skill in the art will appreciate that the hardware, firmware/software utility, and software components and basic configuration thereof depicted in the following figures may vary. For example, the illustrative components of the IHS are not intended to be exhaustive, but rather are representative to highlight some of the components that are utilized to implement certain of the described embodiments. For example, different configurations of an IHS may be provided, containing other devices/components, which may be used in addition to, or in place of, the hardware depicted, and may be differently configured. The depicted example is not meant to imply architectural or other limitations with respect to the presently described embodiments and/or the general invention.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes one or more processor(s) 102 coupled to system memory 106 via system interconnect 104. System interconnect 104 can be interchangeably referred to as a system bus, in one or more embodiments. Also coupled to system interconnect 104 is storage 134 within which can be stored one or more software and/or firmware modules and/or data (not specifically shown). In one embodiment, storage 134 can be a hard drive or a solid state drive. The one or more software and/or firmware modules within storage 134 can be loaded into system memory 106 during operation of IHS 100. As shown, system memory 106 can include therein a plurality of modules, including operating system (O/S) 108, Basic Input/Output System (BIOS) 110, application(s) 112 and firmware (not shown). In one or more embodiments, BIOS 110 comprises additional functionality associated with unified extensible firmware interface (UEFI), and can be more completely referred to as BIOS/UEFI 110 in these embodiments. The various software and/or firmware modules have varying functionality when their corresponding program code is executed by processor(s) 102 or other processing devices within IHS 100.

IHS 100 further includes one or more input/output (I/O) controllers 120 which support connection to, and processing of, signals from one or more connected input device(s) 122, such as a keyboard, mouse, touch screen, or microphone. I/O controllers 120 also support connection to, and forwarding of, output signals to one or more connected output device(s) 124, such as a monitor or display device or audio speaker(s). In addition, IHS 100 includes universal serial bus (USB) 126 which is coupled to I/O controller 120. Additionally, in one or more embodiments, one or more device interface(s) 128, such as an optical reader, a universal serial bus (USB), a card reader, Personal Computer Memory Card International Association (PCMCIA) port, and/or a high-definition multimedia interface (HDMI), can be associated with IHS 100. Device interface(s) 128 can be utilized to enable data to be read from, or stored to, corresponding removable storage device(s) 130, such as a compact disk (CD), digital video disk (DVD), flash drive, or flash memory card. In one or more embodiments, device interface(s) 128 can also provide an integration point for connecting other device(s) to IHS 100. In one implementation, IHS 100 connects to remote IHS 140 using device interface(s) 128. In such implementation, device interface(s) 128 can further include General Purpose I/O interfaces such as $I^2C$, SMBus, and peripheral component interconnect (PCI) buses.

IHS 100 further comprises power supply unit (PSU) 116 which is electrically coupled to one or more components including processor 102. As illustrated, PSU 116 includes PSU fault detection module 118 and a plurality of microcontroller units (MCUs) including a primary MCU and a secondary MCU, collectively illustrated as MCUs 146. IHS 100 also comprises storage 134.

IHS 100 comprises a network interface device (NID) 132. NID 132 enables IHS 100 to communicate and/or interface with other devices, services, and components that are located external to IHS 100. These devices, services, and components can interface with IHS 100 via an external network, such as example network 136, using one or more communication protocols. In particular, in one implementation, IHS 100 uses NID 132 to connect to remote IHS 140 via an external network, such as network 136.

Network 136 can be a wired local area network, a wireless wide area network, wireless personal area network, wireless local area network, and the like, and the connection to and/or between network 136 and IHS 100 can be wired or wireless or a combination thereof. For purposes of discussion, network 136 is indicated as a single collective component for simplicity. However, it is appreciated that network 136 can comprise one or more direct connections to other devices as well as a more complex set of interconnections as can exist within a wide area network, such as the Internet.

Figure 2:
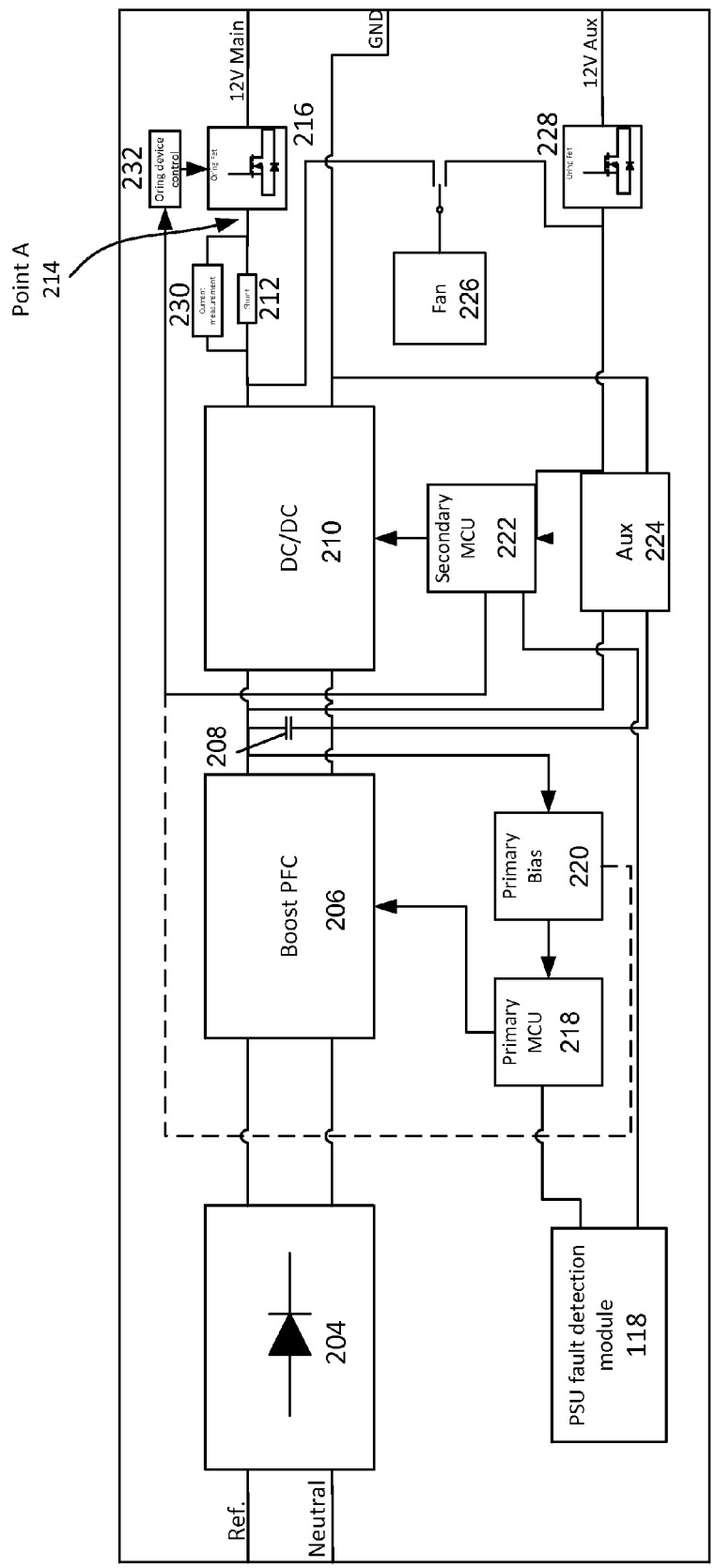
FIG. 2 depicts a block diagram illustration of a power supply unit (PSU), according to one or more embodiments.

FIG. 2 depicts a PSU and a number of functional components, according to one embodiment. PSU 116 comprises diode rectifier 204 and boost power factor correction (PFC) 206 coupled to diode rectifier 204. PSU 116 also comprises a direct-current input voltage to direct-current output voltage (DC/DC) converter unit 210 coupled to boost PFC 206. Coupled between output ports of boost PFC 206 is bulk capacitor 208. Additionally, PSU comprises current shunt 212 coupled to DC/DC converter unit 210 and first ORing device 216 coupled to the current shunt 212. As illustrated within FIG. 2, first ORing device 216 propagates a regulated 12 volt DC "MAIN" output. Also included within PSU 116 are primary MCU 218 coupled to boost PFC 206, primary Bias component 220 coupled to primary MCU 218, and secondary MCU 222 coupled to DC/DC converter unit 210. PSU 116 also comprises auxiliary power rail 224 coupled to boost PFC 206, and second ORing device 228 coupled to auxiliary power rail 224. In one or more aspects, each of ORing devices 216, 228 can be implemented using one of a Metal Oxide Semiconductor Field Effect Transistor (MOSFET) and a Field Effect Transistor (FET). Fan 226 is also included within PSU 116. In one embodiment, PSU 116 includes an input filter (not shown) to filter an AC power supply. PSU 116 also comprises a PSU fault detection module 118 that is communicatively coupled to primary MCU 218 and secondary MCU 222. In one embodiment, PSU 116 is connected within IHS 100, while, in another embodiment, PSU 116 can be physically and electrically removed from IHS 100.

PSU fault detection module 118 is configured to detect an event that matches one of a plurality of pre-established PSU diagnostic trigger events. In response to detecting the event, PSU fault detection module 118 initiates a series of tests and checks of selected sub-systems to identify an event location. In addition, PSU fault detection module 118 determines whether the event is a fault event or a power-up event that follows a previous fault event. In response to determining that the event is a fault event, PSU fault detection module 118 determines whether the fault event occurred during a period when PSU 116 was connected within IHS 100. In response to determining that the fault event occurred while PSU 116 was connected within IHS 100, PSU fault detection module 118 electrically isolates the PSU from the IHS using the ORing device, and determines whether a short circuit exists within the electrically isolated PSU. In response to determining that a short circuit exists within the electrically isolated PSU, PSU fault detection module 118 determines that PSU 116 is not functioning properly and provides a notification of a malfunction of PSU 116.

In one embodiment, in response to determining that the fault event occurred while PSU 116 was connected within IHS 100, PSU fault detection module 118 limits an output current of PSU 116 to a pre-established low value. In addition, secondary MCU 222 turns OFF first ORing device 216 via ORing device control module 232. PSU fault detection module 118 limits the output current to the pre-established low value to prevent PSU 116 from sending additional current associated with the fault to a fault point, as a precautionary measure for a case in which the fault happens to be located within PSU 116. PSU fault detection module 118 regulates an output voltage, which is detected at point A 214, to a pre-established first low level. By regulating the output voltage to the pre-established first low level, PSU fault detection module 118 ensures that a "parasitic" body diode within the ORing device (e.g., ORing device 216) remains in an OFF state, while allowing PSU 116 to function properly if the fault is not located within PSU 116. PSU fault detection module 118 then raises the output voltage with a pre-determined low slew rate, and determines whether a shunt current that is received at an input of ORing device 216 reaches a maximum value. In one implementation, PSU fault detection module 118 determines shunt current levels using current measurement module 230. PSU fault detection module 118 raises the output voltage with the pre-determined low slew rate as a precautionary measure that provides more time to respond to and limit any further increase in the current once the current reaches the maximum value. In response to the shunt current reaching the maximum value, PSU fault detection module 118 determines that the fault is located beyond the shunt (i.e., outside of the PSU) and that PSU 116 is functioning properly. However, in response to the shunt current not reaching the maximum value, PSU fault detection module 118 determines the fault is located before the shunt (i.e., inside of the PSU) and that PSU 116 is not functioning properly. In one or more aspects, PSU fault detection module 118, in response to detecting another, identifiable type of fault while raising the output voltage with a pre-determined low slew rate, determines that PSU 116 is not functioning properly. More specifically, the other identifiable type of fault is a fault that was not previously detected.

In one embodiment, PSU fault detection module 118, in response to determining that the event is a fault event, determines whether the fault event is a first fault event, which is detected by IHS 100, as opposed to a second fault event, which is detected by PSU 116. In response to determining that the fault event is the first fault event, PSU fault detection module 118 detects at least one of: (a) transmission of a command from IHS 100 to PSU 116 to initiate the series of tests and checks and (b) a change of a logic level on a selected pin communicatively coupled to PSU 116.

PSU fault detection module 118 initiates the series of tests and checks to determine one or more of a corresponding health of: (a) the auxiliary power supply rail; (b) MCUs 146 using a Built-in Self Test (BIST); (c) the fan; (d) the input filter, the diode rectifier and the PFC stage; and (e) the DC/DC stage.

In one or more aspects, PSU fault detection module 118 regulates the output voltage to a voltage that is lower than a voltage required to forward-bias a body diode of ORing device 216. As a result, PSU fault detection module 118 turns off the body diode of ORing device 216 in order to electrically isolate IHS 100 from PSU 116 and check a health of control sub-systems of PSU 116. In one implementation, PSU fault detection module 118 regulates the output voltage to 0.5 volts, while the body diode of ORing device 216 can be forward biased using a potential difference of substantially 0.7 volts.

In one or more aspects, PSU fault detection module 118 attempts to regulate the output voltage to the pre-established first low level. If the fault is located inside of PSU 116, PSU fault detection module 118 is unable to properly regulate the voltage to the pre-established first low value (e.g., 0.5V) using a small current (i.e., without having a very large current). However, in response to successfully regulating the output voltage, PSU fault detection module 118 determines that a short circuit exists outside of PSU 116, and that ORing device 216 and all control subsystems in PSU 116 are functioning properly.

In one or more aspects, PSU fault detection module 118 determines that the event is a power-up event that occurred while PSU 116 was electrically removed from IHS 100, where the power-up event follows a fault event. As a result, PSU fault detection module 118 limits an output current of PSU 116 to a second pre-established low value. In one or more aspects, the second pre-established low value is selected to comply with Safe Extra Low Voltage (SELV) requirements. PSU fault detection module 118 regulates the output voltage to a nominal value to enable PSU 116 to be turned on. PSU fault detection module 118 then performs checks of selected sub-systems, and determines whether a subsequent and/or additional event occurs while the checks are being performed. In response to the subsequent and/or additional event occurring while the checks are being performed, PSU fault detection module 118 determines that PSU 116 is not functioning properly.

In response to determining that the detected event is not a fault event, PSU fault detection module 118 identifies the detected event as a power-up event. In one or more aspects, the power-up event occurs when alternating current (AC) system power is re-applied to PSU 116 following detection of the fault event.

FIGS. 3-6 present flowcharts illustrating example methods by which PSU 116, and specifically, MCUs 218, 222 and PSU fault detection module 118 presented within the preceding figures, collaborate to perform different aspects of the processes that enable one or more embodiments of the disclosure. Method 300 represents a method for performing a fault diagnosis while the PSU is connected within the IHS. Method 400 represents another method for performing a fault diagnosis while the PSU is connected within the IHS. Method 500 represents a method for performing a fault diagnosis while the PSU is removed from the IHS. Method 600 represents a method for selectively performing a fault diagnosis based on whether the PSU is connected within or removed from the IHS. The description of each method is provided with general reference to the specific components illustrated within the preceding figures. It is appreciated that certain aspects of the described methods may be implemented via other processing devices and/or execution of other code/firmware. In the discussion of FIGS. 3-6, reference is also made to elements described in FIGS. 1-2.

Method 300 begins at the start block and proceeds to block 302 at which PSU fault detection module 118 initiates a built in self-test (BIST). PSU fault detection module 118 determines whether the BIST is successfully completed (decision block 304). If the BIST is successfully completed, PSU fault detection module 118 determines whether the bulk capacitor voltage is at a pre-established, acceptable level (decision block 306). One skilled in the art will appreciate that the acceptable level for the bulk capacitor voltage varies across different PSUs. In response to determining that the bulk capacitor voltage is at an acceptable level, PSU fault detection module 118 runs the fan from Aux power (block 308). However, if the bulk capacitor voltage is not at an acceptable level, the process continues to block 326 at which PSU fault detection module 118/MCU 218 determines that the PSU is not functioning properly. PSU fault detection module 118 determines whether the fan is functioning properly (decision block 310). If the fan is functioning properly, the process continues to block 312. If the fan is not functioning properly, the process continues to block 326 at which PSU fault detection module 118/MCU 218 determines that the PSU is not functioning properly.

At block 312, PSU fault detection module 118 enables secondary MCU to limit an output current of the PSU to a pre-established low value. In addition, PSU fault detection module 118 turns off the ORing device. PSU fault detection module 118 limits the output current to the pre-established low value to prevent PSU 116 from sending additional current associated with the fault to a fault point. The prevention is initiated as a precautionary measure for a case in which the fault happens to be located within PSU 116. The PSU fault detection module attempts to regulate an output voltage to a pre-established first low level using secondary MCU (block 314). PSU fault detection module 118 determines whether the output voltage is successfully regulated (block 316). If the output voltage is not successfully regulated, the process continues to block 326. If the output voltage is successfully regulated, PSU fault detection module 118 raises the output voltage with a pre-determined low slew rate using secondary MCU (block 318), and determines whether an additional, new type of event or fault is detected (block 320). If an additional, new type of event or fault is not detected, PSU fault detection module 118, while raising the output voltage with the pre-determined low slew rate, determines whether a shunt current that is received at an input of ORing device 216 reaches a maximum value (block 322). In response to the shunt current reaching the maximum value, PSU fault detection module 118/MCU 218 determines that PSU 116 is functioning properly (block 324). However, in response to the shunt current not reaching the maximum value, the PSU fault detection module 118/MCU 218 determines that the PSU is not functioning properly (block 326). The process concludes at the end block.

Method 400 begins at the start block and proceeds to block 402 at which PSU fault detection module 118 monitors for detection of an event that matches one of a plurality of pre-established PSU diagnostic trigger events. In response to detecting the event, PSU fault detection module 118, of PSU 116, initiates a series of tests and checks of selected sub-systems, such as the Auxiliary power sub-system and the controller sub-system, to identify an event location (block 404). PSU fault detection module 118 determines whether the tests/checks have been successfully completed (block 406). If the tests/checks cannot be successfully completed, the process continues to block 418 at which PSU fault detection module 118/MCU 218 determines that PSU 116 is not healthy or is not functioning properly. If the tests/checks have been successfully completed, PSU fault detection module 118 determines whether the event is a fault event or a power-up event that follows a previous fault event (block 408). In response to determining that the event is a fault event, PSU fault detection module 118 determines whether the fault event occurred during a period when PSU 116 was connected within the IHS (block 410). In response to determining that the fault event occurred while PSU 116 was connected within IHS 100, PSU fault detection module 118 electrically isolates the PSU from the IHS, while (a) placing ORing device 216 in an OFF state and (b) verifying that the ORing device is functioning properly (block 412).

Figure 3:
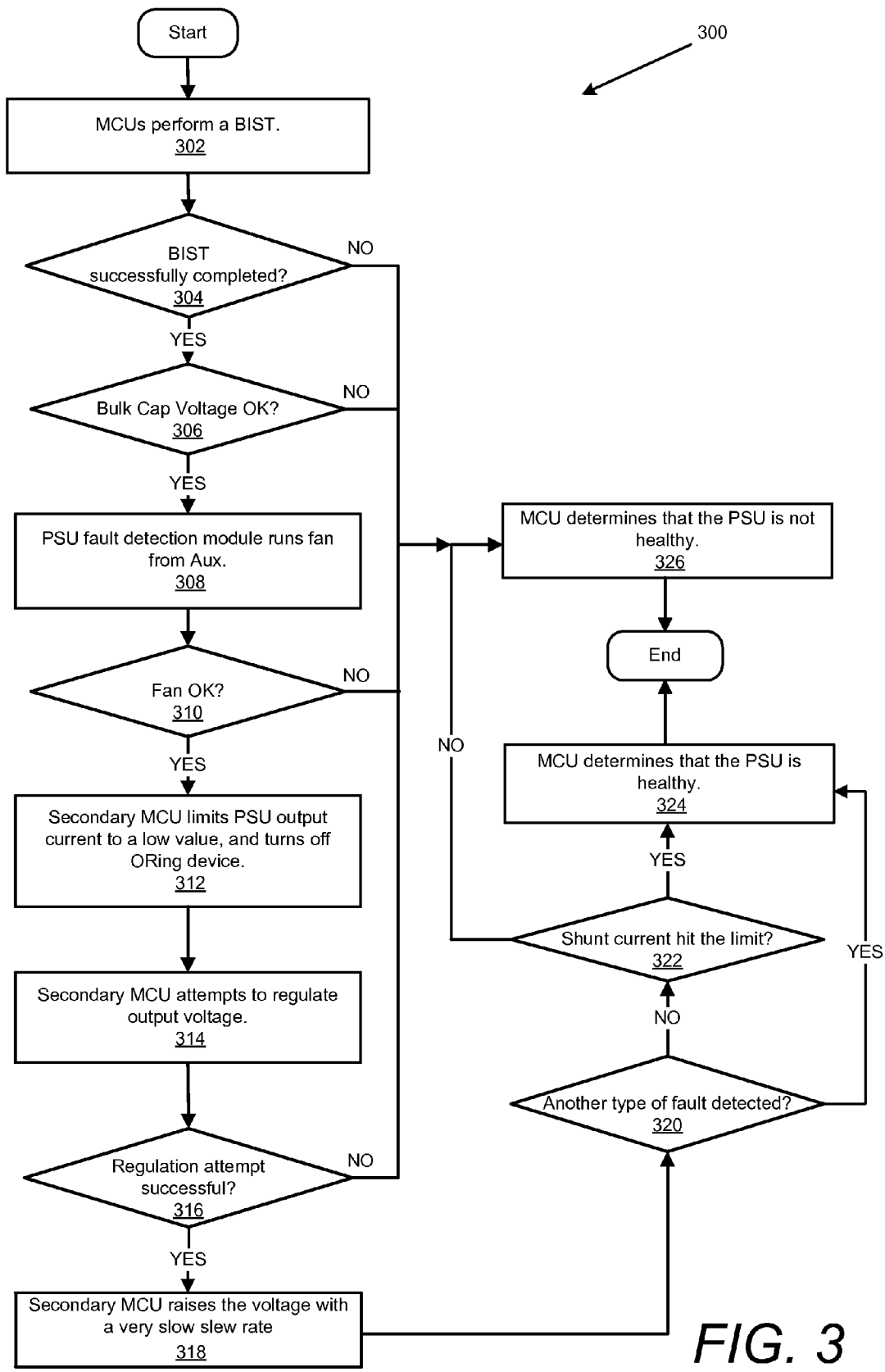
FIG. 3 is a flow chart illustrating a method for performing a fault diagnosis while the PSU is connected within the IHS, according to one embodiment.
Figure 4:
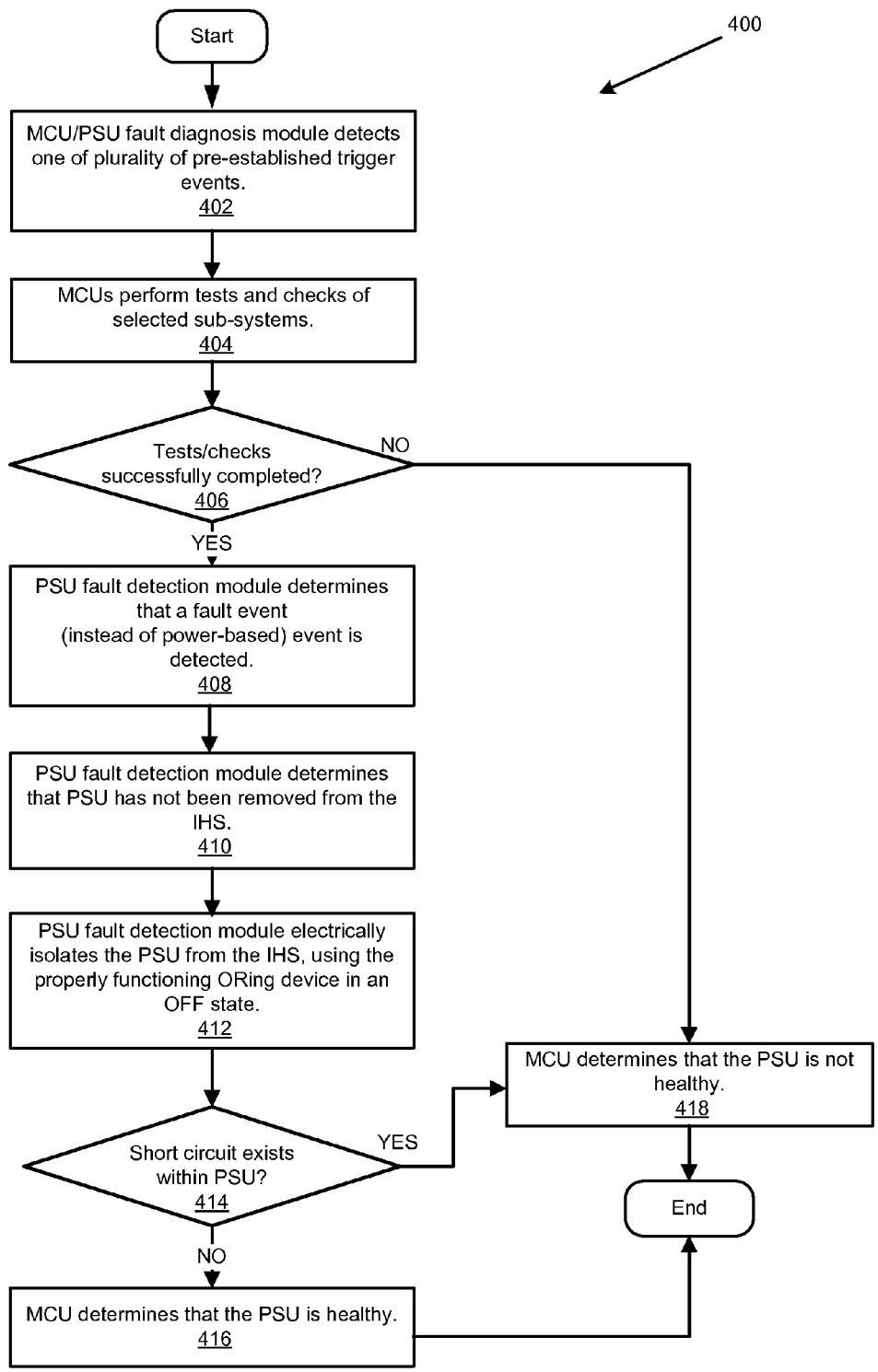
FIG. 4 is a flow chart illustrating another method for performing a fault diagnosis while the PSU is connected within the IHS, according to one embodiment.
Figure 5:
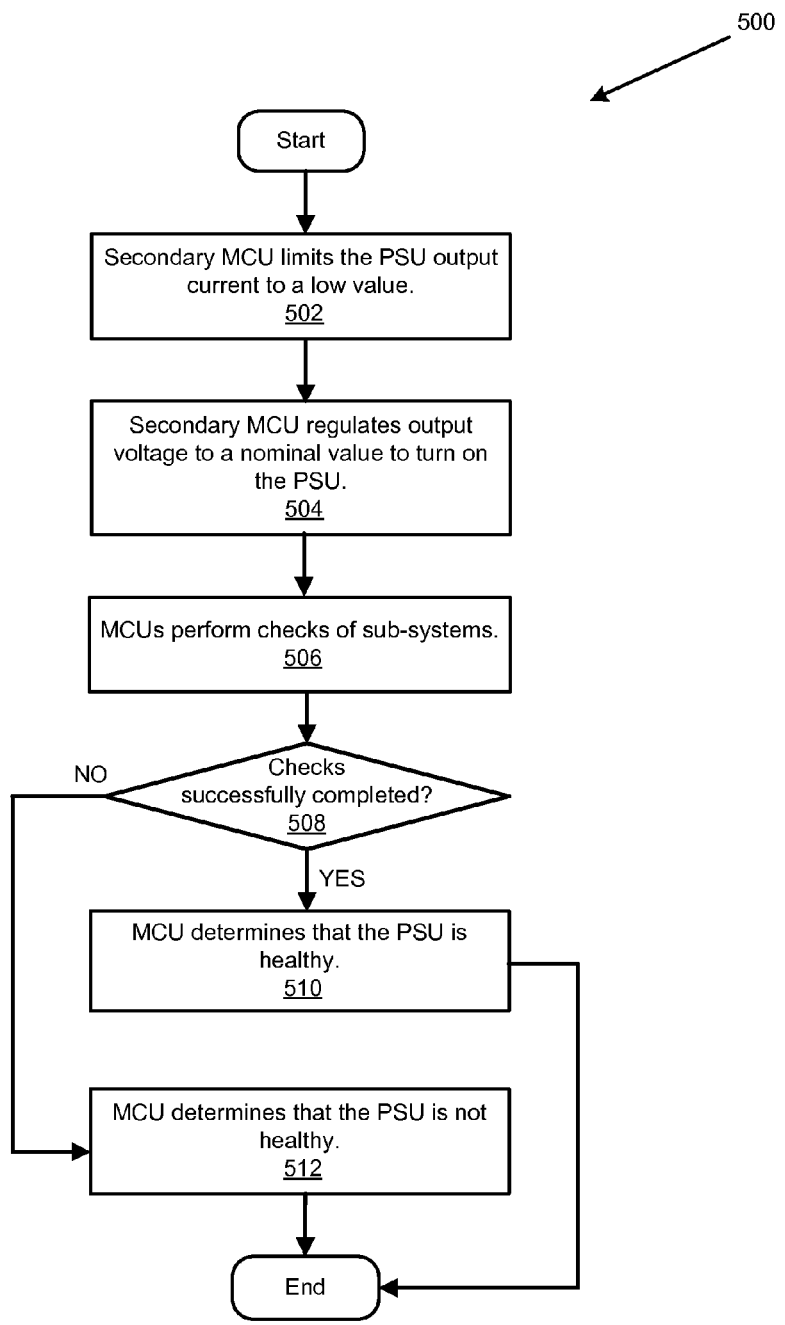
FIG. 5 is a flow chart illustrating a method for performing a fault diagnosis while the PSU is removed from the IHS, according to one embodiment.
Figure 6:
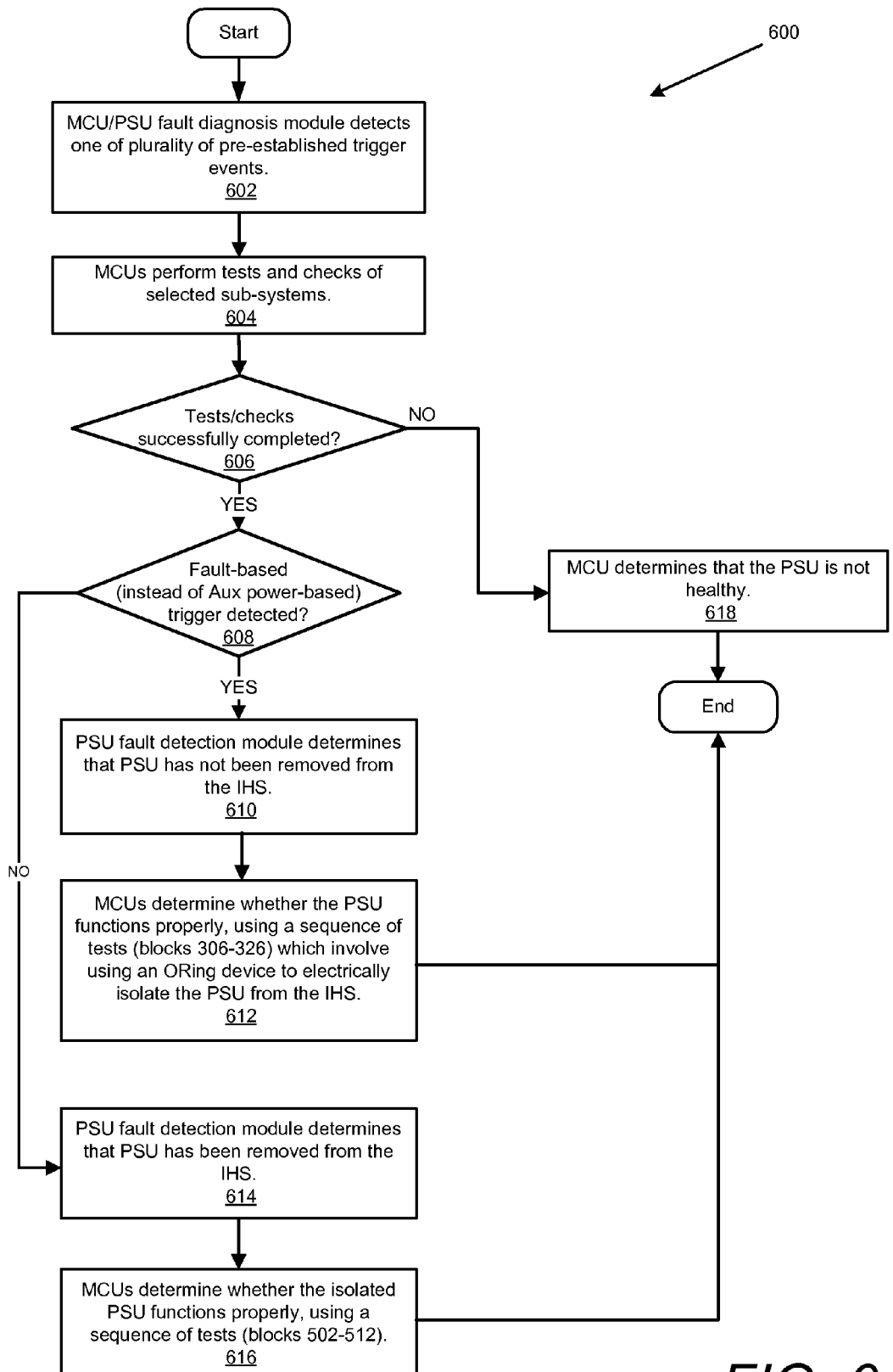
FIG. 6 is a flow chart illustrating a method for selectively performing a fault diagnosis based on whether the PSU is connected within or removed from the IHS, according to one embodiment.

The process of electrically isolating the PSU from the IHS using ORing device 216 is described within blocks 314 and 316 of FIG. 3. PSU fault detection module 118 determines whether a short circuit exists within the electrically isolated PSU (decision block 414). In response to determining that a short circuit does not exist within the electrically isolated PSU, PSU fault detection module 118/MCU 218 determines that PSU 116 is healthy or is functioning properly (block 416). However, in response to determining that a short circuit exists within the electrically isolated PSU, PSU fault detection module 118/MCU 218 determines that PSU 116 is not healthy or is not functioning properly and provides a notification of a malfunction of the PSU (block 418). The process concludes at the end block.

Method 500 begins at the start block and proceeds to block 502 at which PSU fault detection module 118, using the secondary MCU, limits an output current of PSU 116 to a second pre-established low value, following detection of a power-up event. In order to limit the output current of PSU 116 to the second pre-established low value, PSU fault detection module 118 determines that the power-up event was previously detected, where the power-up event follows a fault event. In addition, PSU fault detection module 118 determines that the power-up event/trigger occurred while PSU 116 was electrically removed from the IHS. PSU fault detection module 118 regulates the output voltage to a nominal value to enable PSU 116 to be turned on (block 504). The PSU fault detection module then performs checks of selected sub-systems (block 506), and determines whether the checks were successfully completed (decision block 508). If the checks were successfully completed, PSU fault detection module 118/MCU 218 determines that the PSU is functioning properly (block 510). If the checks were not successfully completed, PSU fault detection module 118/MCU 218 determines that PSU 116 is not functioning properly (block 512). The process concludes at the end block.

Method 600 begins at the start block and proceeds to block 602 at which PSU fault detection module 118 monitors for detection of an event that matches one of a plurality of pre-established PSU diagnostic trigger events. In response to detecting the event, PSU fault detection module initiates a series of tests and checks of selected sub-systems to identify an event location (block 604). PSU fault detection module determines whether the tests/checks have been successfully completed (block 606). If the tests/checks were not successfully completed, PSU fault detection module 118 determines that PSU 116 is not functioning properly (block 618). If the tests/checks have been successfully completed, PSU fault detection module determines whether the event is a fault event or a power-up event that follows a previous fault event (block 608). In response to determining that the event is a fault event, PSU fault detection module determines whether the fault event occurred during a period when the PSU was connected within the IHS (block 610). In response to determining that the fault event occurred while the PSU was connected within the IHS, PSU fault detection module 118/MCUs determine whether the PSU functions properly, using a sequence of tests (as described in blocks 306-326 of FIG. 3) which involve using an ORing device to electrically isolate the PSU from the IHS (block 612).

However, in response to PSU fault detection module 118 determining, at decision block 608, that the event is a power-up event, where the power-up event follows a fault event, PSU fault detection module 118 also determines that the power-up event/trigger occurred while PSU 116 was electrically removed from IHS 100 (block 614). PSU fault detection module 118/MCUs then determine, using a sequence of tests (as described within blocks 502-512 of FIG. 5), whether the isolated PSU functions properly (block 616). The process concludes at the end block.

In the above described flow charts, one or more of the methods may be embodied in a computer readable device containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A power supply unit (PSU) that can be removably connected within an information handling system (IHS) having a processor and a memory system, the PSU comprising:
    a primary microcontroller unit (MCU);
    a secondary MCU;
    at least one sub-system each associated with respective MCUs;
    an ORing device that blocks current flowing into the PSU;
    a PSU fault detection component communicatively coupled to said MCUs, wherein said PSU fault detection component is configured to:
        detect an event that is a fault event;
        determine whether the fault event occurred during a period when the PSU was connected within the IHS;
        in response to determining that the fault event occurred while the PSU was connected within the HIS:
            limit an output current of the PSU to a pre-established low value;
            regulate an output voltage to a pre-established first low level;
            raise the output voltage with a pre-determined low slew rate;
            determine whether a shunt current that is received at an input of the ORing device reaches a maximum value;
            in response to the shunt current reaching the maximum value, determine that the PSU is functioning properly;
            in response to the shunt current not reaching the maximum value, determine that the PSU is not functioning properly; and
            electrically isolate the PSU from the IHS using the ORing device;
        determines whether a short circuit exists within the electrically isolated PSU; and
        in response to determining that a short circuit exists within the electrically isolated PSU, determine that the PSU is not functioning properly and providing a notification of a malfunction of the PSU.

2. The PSU of claim 1, wherein the PSU fault detection component:
    detects an event that matches one of a plurality of pre-established PSU diagnostic trigger events;
    in response to detecting the event, initiates a series of tests and checks of selected sub-systems among the at least one sub-system to identify an event location;
    determine whether the event is a fault event; and
    in response to determining that the event is a fault event, perform said determining whether the fault event occurred during the period when the PSU was connected within the IHS.

3. The PSU of claim 1, wherein the PSU fault detection component:
    determines whether the detected event is a power up event that follows a fault event and which occurred while the PSU was not connected within the IHS;

in response to determining that the power up event occurred while the PSU was not connected within the IHS, limits an output current of the PSU to a second pre-established low value;
regulates the output voltage to a nominal value to enable the PSU to be turned on;
performs checks of selected sub-systems;
determines whether an additional different event occurs while the checks are being performed; and
in response to another type of event occurring while the checks are being performed, determines that the PSU is not functioning properly.

4. The PSU of claim 1, wherein the PSU fault detection component:
in response to determining that the event is a fault event, determines whether the fault event is a first fault event detected by the IHS as opposed to a second fault event detected by the PSU;
in response to determining that the fault event is the first fault event, performs, prior to said initiating said series of tests and checks, at least one of: (a) transmission of a command to the PSU to initiate the series of tests and checks and (b) a change of a logic level on a selected pin communicatively coupled to the PSU;
performs said initiating said series of tests and checks in response to determining that the fault event is the second fault event;
in response to determining that the detected event is not a fault event, identifies the detected event as a power-up event;
wherein the power-up event occurs when alternating current (AC) system power is re-applied to the PSU following detection of the fault event.

5. The PSU of claim 1, wherein the PSU fault detection component:
regulates said output voltage to a voltage that is lower than a voltage required to forward-bias a body diode of the ORing device to turn off the ORing device in order to electrically isolate the system from the PSU and check a health of control sub-systems of the PSU.

6. The PSU of claim 1, wherein the PSU fault detection component:
attempts to regulate the output voltage to the pre-established first low level; and
in response to successfully regulating the output voltage, determines that a short circuit exists outside of the PSU, and that the ORing device and all control subsystems in the PSU are functioning properly.

7. The PSU of claim 1, wherein the PSU fault detection component:
in response to detecting another, identifiable type of fault while raising the output voltage with a pre-determined low slew rate, determines that the PSU is not functioning properly.

8. The PSU of claim 1, wherein the PSU fault detection component:
performs said regulating of the output voltage to a voltage of substantially 0.5 volts, wherein the ORing device body diode is forward biased using a potential difference of substantially 0.7 volts.

9. In a power supply unit (PSU) having multiple microcontroller units (MCUs) and corresponding sub-systems, and an ORing device that blocks current flowing into the PSU, wherein the PSU can be removably connected within an information handling system (IHS), a processor-executed method comprising:
detecting an event that is a fault event;
determining whether the fault event occurred during a period when the PSU was connected within the IHS;
in response to determining that the fault event occurred while the PSU was connected within the IHS:
limit an output current of the PSU to a pre-established low value;
regulate an output voltage to a pre-established first low level;
raise the output voltage with a pre-determined low slew rate;
determine whether a shunt current that is received at an input of the ORing device reaches a maximum value;
in response to the shunt current reaching the maximum value, determine that the PSU is functioning properly;
in response to the shunt current not reaching the maximum value, determine that the PSU is not functioning properly; and
electrically isolating the PSU from the IHS using the ORing device;
determining whether a short circuit exists within the electrically isolated PSU; and
in response to determining that a short circuit exists within the electrically isolated PSU, determining that the PSU is not functioning properly and providing a notification of a malfunction of the PSU.

10. The method of claim 9, further comprising:
attempting to regulate the output voltage to the pre-established first low level; and
in response to successfully regulating the output voltage, determining that a short circuit exists outside of the PSU, and that the ORing device and all control subsystems in the PSU are functioning properly.

11. The method of claim 9, further comprising:
in response to detecting another, identifiable type of fault while raising the output voltage with a pre-determined low slew rate, determining that the PSU is not functioning properly.

12. The method of claim 9, further comprising:
performing said regulating of the output voltage to a voltage of substantially 0.5 volts, wherein the ORing device body diode is forward biased using a potential difference of substantially 0.7 volts.

13. A power supply unit (PSU) that can be removably connected within an information handling system (IHS) having a processor and a memory system, the PSU comprising:
a primary microcontroller unit (MCU);
a secondary MCU;
at least one sub-system each associated with respective MCUs;
an ORing device that blocks current flowing into the PSU;
a PSU fault detection component communicatively coupled to said MCUs, wherein said PSU fault detection component is configured to:
detect an event that is a fault event;
determine whether the fault event occurred during a period when the PSU was connected within the IHS;
in response to determining that the fault event occurred while the PSU was connected within the IHS, electrically isolate the PSU from the IHS using the ORing device;
determine whether a short circuit exists within the electrically isolated PSU; and
in response to determining that a short circuit exists within the electrically isolated PSU, determine that the PSU is not functioning properly and providing a notification of a malfunction of the PSU;

wherein the PSU further comprises a fan, an auxiliary power supply rail, an input filter, a diode rectifier, a power factor correlation (PFC) stage and a direct-current input voltage to direct-current output voltage (DC/DC) converter stage coupled to the PFC stage, wherein the PSU fault detection component initiates the series of tests and checks to:

determine one or more of a corresponding health of: (a) the auxiliary power supply rail; (b) the MCUs using a Built-in Self Test (BIST); (c) the fan; (d) the input filter, the diode rectifier and the PFC stage; and (e) the DC/DC stage.

14. The method of claim 9, further comprising:

regulating said output voltage to a voltage that is lower than a voltage required to forward-bias a body diode of the ORing device to turn off the ORing device in order to electrically isolate the system from the PSU and check a health of control sub-systems of the PSU.

15. The method of claim 9, further comprising:

detecting an event that matches one of a plurality of pre-established PSU diagnostic trigger events;

in response to detecting the event, initiating a series of tests and checks of selected sub-systems among the at least one sub-system to identify an event location;

determining whether the event is a fault event; and in response to determining that the event is a fault event, performing said determining whether the fault event occurred during the period when the PSU was connected within the IHS.

16. The method of claim 9, further comprising:

determining whether the detected event is a power up event that follows a fault event and which occurred while the PSU was not connected within the IHS;

in response to determining that the power up event occurred while the PSU was not connected within the IHS, limiting an output current of the PSU to a second pre-established low value;

regulating the output voltage to a nominal value to enable the PSU to be turned on;

performing checks of selected sub-systems;

determining whether an additional different event occurs while the checks are being performed; and in response to another type of event occurring while the checks are being performed, determining that the PSU is not functioning properly.

17. The method of claim 9, further comprising:

in response to determining that the event is a fault event, determining whether the fault event is a first fault event detected by the IHS as opposed to a second fault event detected by the PSU;

in response to determining that the fault event is the first fault event, performing, prior to said initiating said series of tests and checks, at least one of: (a) transmission of a command to the PSU to initiate the series of tests and checks and (b) a change of a logic level on a selected pin communicatively coupled to the PSU;

performing said initiating said series of tests and checks in response to determining that the fault event is the second fault event;

in response to determining that the detected event is not a fault event, identifying the detected event as a power-up event;

wherein the power-up event occurs when alternating current (AC) system power is re-applied to the PSU following detection of the fault event.

18. The method of claim 9, wherein the PSU further comprises a fan, an auxiliary power supply rail, an input filter, a diode rectifier, a power factor correlation (PFC) stage and a direct-current input voltage to direct-current output voltage (DC/DC) converter stage coupled to the PFC stage, wherein the method further comprises:

determine one or more of a corresponding health of: (a) the auxiliary power supply rail; (b) the MCUs using a Built-in Self Test (BIST); (c) the fan; (d) the input filter, the diode rectifier and the PFC stage; and (e) the DC/DC stage.

* * * * *